US011429469B2

(12) United States Patent
Khakifirooz et al.

(10) Patent No.: US 11,429,469 B2
(45) Date of Patent: Aug. 30, 2022

(54) DEFECTIVE BIT LINE MANAGEMENT IN CONNECTION WITH A MEMORY ACCESS

(71) Applicant: Intel Corporation, Santa Clara, CA (US)

(72) Inventors: Ali Khakifirooz, Brookline, MA (US); Pranav Kalavade, San Jose, CA (US); Ravi H. Motwani, Fremont, CA (US); Chang Wan Ha, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/195,579

(22) Filed: Mar. 8, 2021

(65) Prior Publication Data
US 2021/0193200 A1 Jun. 24, 2021

Related U.S. Application Data

(62) Division of application No. 16/562,745, filed on Sep. 6, 2019, now Pat. No. 10,942,799.

(51) Int. Cl.
G06F 11/07 (2006.01)
G11C 16/34 (2006.01)
G11C 7/12 (2006.01)
G11C 16/14 (2006.01)
G11C 29/44 (2006.01)

(52) U.S. Cl.
CPC .............. G06F 11/076 (2013.01); G11C 7/12 (2013.01); G11C 16/14 (2013.01); G11C 16/3431 (2013.01); G11C 29/44 (2013.01)

(58) Field of Classification Search
CPC ..................... G06F 11/076; G11C 16/3431
See application file for complete search history.

(56) References Cited

U.S. PATENT DOCUMENTS

| 6,496,417 | B1* | 12/2002 | Shiau | G11C 16/107 365/185.18 |
|---|---|---|---|---|
| 7,379,330 | B2 | 5/2008 | Conley et al. | |
| 8,654,585 | B2 | 2/2014 | Oh et al. | |
| 9,146,824 | B1 | 9/2015 | Chen et al. | |
| 2003/0007399 | A1* | 1/2003 | Kinoshita | G11C 29/88 365/200 |

(Continued)

OTHER PUBLICATIONS

Extended European Search Report for Patent Application No. 20181409.2, dated Dec. 9, 2020, 12 pages.

(Continued)

Primary Examiner — Joseph D Torres
(74) Attorney, Agent, or Firm — Compass IP Law PC

(57) ABSTRACT

Examples herein relate to determining a number of defective bit lines in a memory region prior to applying a program or erase voltages. If a threshold number of bit lines that pass during a program or erase verify operation is used to determine if the program or erase operation passes or fails, the determined number of defective bit lines can be used to adjust the determined number of passes or fails. In some cases, examples described herein can avoid use of extra bit lines and look-up table circuitry to use in place of defective bit lines and save silicon space and cost associated with the use of extra bit-lines. In some examples, a starting magnitude of a program voltage signal can be determined by considering a number of defective bit lines.

20 Claims, 13 Drawing Sheets

(56) References Cited

U.S. PATENT DOCUMENTS

| | | |
|---|---|---|
| 2003/0016560 A1 | 1/2003 | Kawamura |
| 2005/0276129 A1 | 12/2005 | Meihong et al. |
| 2006/0050564 A1 | 3/2006 | Kojima et al. |
| 2012/0224429 A1* | 9/2012 | Moschiano ............ G11C 16/06 365/185.19 |
| 2014/0219032 A1* | 8/2014 | Moschiano ........ G11C 16/3454 365/185.19 |
| 2017/0032849 A1* | 2/2017 | Park ....................... G11C 29/40 |
| 2018/0151249 A1* | 5/2018 | Lee ........................ G11C 29/76 |
| 2019/0305890 A1* | 10/2019 | Kumar .............. H03M 13/2778 |

OTHER PUBLICATIONS

Notice of Allowance for U.S. Appl. No. 16/562,745, dated Nov. 5, 2020, 10 pages.

Restriction Requirement for U.S. Appl. No. 16/562,745, dated Sep. 21, 2020, 9 pages.

Thomas Parnell and Roman Pletka, "NAND Flash Basics & Error Characteristics", Why Do We Need Smart Controllers?, Flash Memory Summit 2017, Santa Clara, CA, IBM Research—Zurich, 22 pages.

Vidyabhushan Mohan, "Modeling the Physical Characteristics of NAND Flash Memory", A Thesis Presented to the Faculty of the School of Engineering and Applied Science University of Virginia, May 2010, 68 pages.

* cited by examiner

DEFECTIVE BIT LINE MANAGEMENT IN CONNECTION WITH A MEMORY ACCESS

CLAIM OF PRIORITY

This application is a divisional of U.S. patent application Ser. No. 16/562,745 filed on Sep. 6, 2019, now U.S. Pat. No. 10,942,799. This application is herein incorporated by reference in its entirety.

TECHNICAL FIELD

Various examples described herein relate to memory accesses involving defective bit lines.

BACKGROUND

A memory array, such as a NAND Flash memory array, is typically composed of a group of cells that are accessible through an array of bit lines (columns) and word lines (rows). Due to manufacturing defects, there may be defects present in the memory array. Some of these defects may be common to all or a significant number of the cells that share the same bit line. Examples of such "global" column defects are bit line to bit line electrical short circuits (shorts), bit line to word line shorts, bit line to select gate shorts, and electrically open bit lines.

If column defects are not properly managed, column defects add to the total bit error rate (BER) of the memory array. Furthermore, depending on the nature of these defects (e.g., open or short), it may be impossible to erase or program the cells connected to them. Erase and program algorithms typically include verify procedures to ensure a majority of cells are properly erased or programmed. The presence of defective bit lines may handicap such verify procedures by falsely adding to the number of cells passing or failing erase or program.

DETAILED DESCRIPTION

Figure 1:
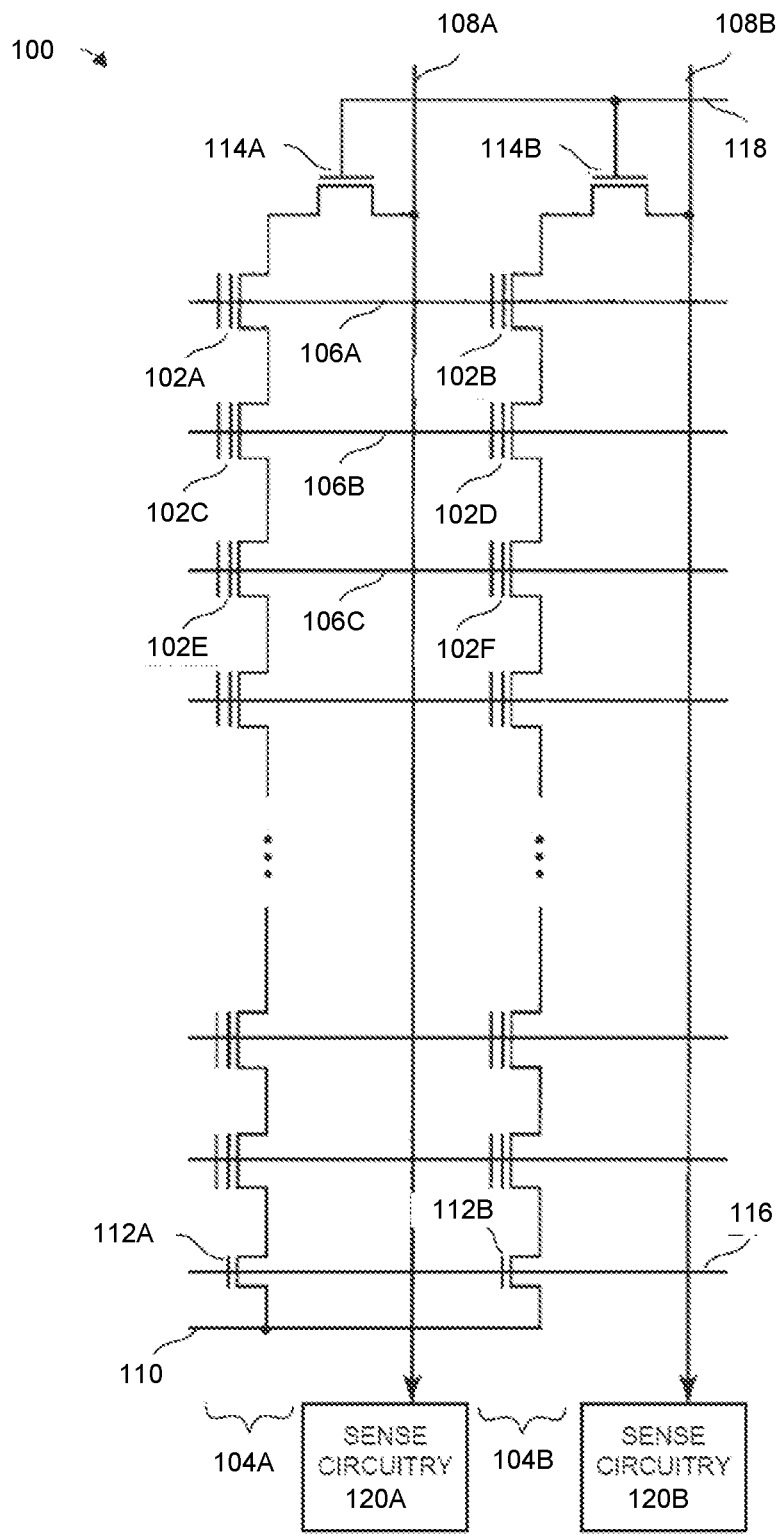
FIG. 1 depicts an example portion of a NAND flash memory array in accordance with some embodiments.

A known approach to manage column defects is to add redundant columns (bit lines) to a memory array and use a mechanism to detect defective columns and replace defective columns with a subset of the redundant columns. Such mechanism may involve running special tests at the fabrication and manufacturing facility (e.g., fab) and building a lookup table that assigns a redundant column to each defective column. Dies with number of defective bit lines higher than allocated redundant bit lines may be marked as failing and excluded from use in final products or not sold.

The lookup table may be stored in the nonvolatile memory, for example, in a special block that maintains the information related to the operation of the memory die to assign a redundant column (bit line) for use. During the operation of the memory, anytime the controller receives an address that is mapped to a defective column, the memory controller translates the address to the corresponding redundant replacement column.

Such repair strategy can have several drawbacks. First, the look up table and additional hardware required to manage the column repair may add to the total area of the array and the cost of the memory die. Second, the number of redundant columns is designed for the worst-case repairable condition. When a lower number of defective columns are present, part of the redundant columns remain unused. The unused portion of redundant columns could have been used to store additional data such as an additional parity data that can be used for error correction, but is unused.

Various embodiments provide a memory system that includes a memory array and a controller capable of detecting and managing column defects in the memory array. The controller is capable of identifying defective columns during operation and modifying program, erase, or read operations to account for the defective columns. The memory controller may execute sense operations to detect defective columns (i.e., open or short bit lines), as a part of a program, erase, or read operation. For example, the number of defective columns can be considered during an erase verify in determining whether an erase operation has successfully completed. The number of defective columns can be considered for a program operation to inhibit those columns and not allow their programming or disregard any program verify associated with those defective columns. The number of defective columns can be considered in a read operation to identify data that will be considered weak values during a soft bit read (SBR) data error correction.

Various embodiments may not use a lookup table or additional hardware used for use of redundant columns to achieve column repair and therefore can reduce a size of a memory die and cost of a memory die. In addition, redundant columns for repair are not provided in the memory system, which can reduce an area allocated for a memory array. Various embodiments can be used for any type of memory array to detect defective bit lines or defective word lines such as dynamic random access memory (DRAM), resistive RAM, storage class memory, NAND storage, three-dimensional (3D) NAND storage, or any type of volatile or non-volatile memory.

In a fabrication or manufacturing facility, tests may be still performed to identify and count defective columns (e.g., short or open circuits) in a memory array and store the number of defective columns and identify defective columns in a storage region. This information can be used to identify a number or actual defective columns so that during program, erase or read operations, the number of defective columns can be pre-determined and do not need to be determined again during a program, erase, or read operation. However, some embodiments permit determination of defective bit lines in connection with program, erase or read operations.

FIG. 1 depicts an example portion of a NAND flash memory array 100 in accordance with some embodiments. NAND flash memory array 100 can include multiple non-volatile memory cells 102 arranged in columns, such as series strings 104. In various embodiments, a memory cell 102 can include a transistor with a floating gate that stores charge indicative of one or more bit values. In series strings 104, drain regions of cells 102 are (with the exception of the top cell) coupled to a source region of another cell 102.

Array 100 also includes word lines 106. Word line 106 can span across multiple series strings 104 (e.g., a word line may be coupled to one memory cell of each series string 104) and are connected to the control gates of each memory cell 102 of a row of the array 100 and used to bias the control gates of the memory cells 102 in the row. Bit lines 108 are each coupled to a series string 104 by a drain select gate 114 and sensing circuitry 120 that detects the state of each cell by sensing voltage or current on a particular bit line 108.

Multiple series strings 104 of memory cells are coupled to a source line 110 by a source select gate 112 and to an individual bit line 108 by a drain select gate 114. The source select gates 112 are controlled by a source select gate control line 116 and the drain select gates 114 are controlled by a drain select gate control line 118.

Figure 3:
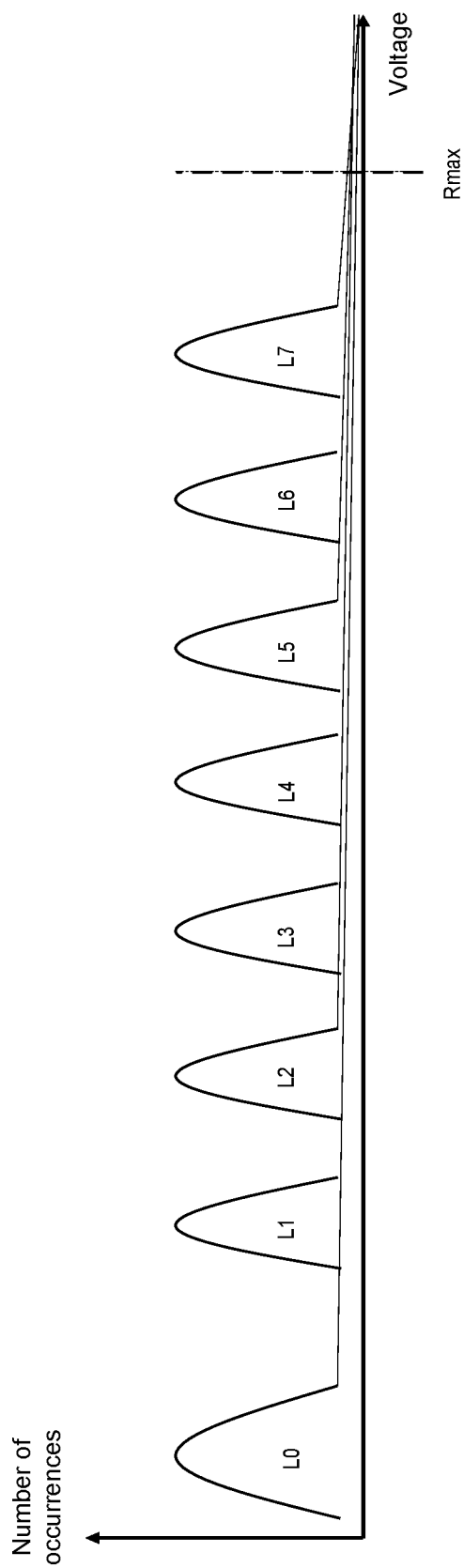
FIG. 3 shows a schematic representation of a distribution of the cell threshold voltages.

In various embodiments, each memory cell 102 can be programmed according to one or more of: a single-level cell (SLC), multi-level cell (MLC), triple-level cells (TLC), quad-level cell (QLC), or other encoding scheme. Each cell's threshold voltage (Vt) is indicative of the data that is stored in the cell. For example, FIG. 3 illustrates example programming of states of TLC NAND flash memory cells 102 for eight states or levels. Level 0 corresponds to an erase state of 111, level 1 corresponds to a first program level of 011. Referring again to FIG. 1, when data (e.g., one or more pages) is written to memory 100, a plurality of the cells may be programmed to a program level.

In various embodiments, a cell state that is set to store multiple bits may form a part of multiple different pages, with each bit of the cell corresponding to a distinct page. For example, for a cell that is to enter a state to store 2 bits (e.g., using an MLC encoding scheme), one bit may correspond to an Upper Page (UP) and the other bit may correspond to a Lower Page (LP). For a cell that is to enter a state to store 3 bits (i.e., using a TLC encoding scheme), one bit may correspond to an LP, one bit may correspond to a UP, and the other bit may correspond to an Extra Page (XP). For a cell that is to store 4 bits (i.e., using a QLC encoding scheme), one bit may correspond to an LP, another bit may correspond to a UP, another bit may correspond to an XP, and the final bit may correspond to a Top Page (TP). Each page (e.g., LP, UP, XP, or TP) may include an aggregation of corresponding bits stored by a plurality of different cells of a word line.

A programming sequence for a group of cells may include programming of all of the intended pages into the group of cells. A programming sequence may include one or more programming passes. A programming pass (which may include one or more programming loops) may program one or more pages. A programming pass may include the application of one or more effective program voltages to cells to be programmed followed by the application of one or more verify voltages to these cells in order to determine which cells have finished programming (subsequent programming passes generally will not apply an effective program voltage and/or a verify voltage to the cells that have finished programming). The application of an effective program voltage to a cell may include changing the voltage difference between a control gate and a channel of the cell in order to change the threshold voltage of the cell. Accordingly, a voltage of a word line (coupled to the control gate of the target cell) and/or a channel of the cell may be set in order to effectuate application of an effective program voltage. As a program voltage is commonly used to refer to a voltage applied to a word line, the effective program voltage can be the voltage difference between a control gate and channel of a cell (which in instances where the channel is held at 0 V will be synonymous with program voltage (V)).

In some cases, bit lines can be defective and exhibit an open circuit or be short circuited to another bit line, to a word line, to select gates, or to other structures. Bit lines that exhibit short or open circuits malfunction. For example, bit line 108A can be conductively coupled to bit line 108B so that bit line 108A is considered shorted to bit line 108B and bit line 108B is considered shorted to bit line 108A. For example, bit line 108A can exhibit an open circuit such that current does not flow through a portion of bit line 108A. Other example defects are possible in bit lines or word lines.

Figure 2A:
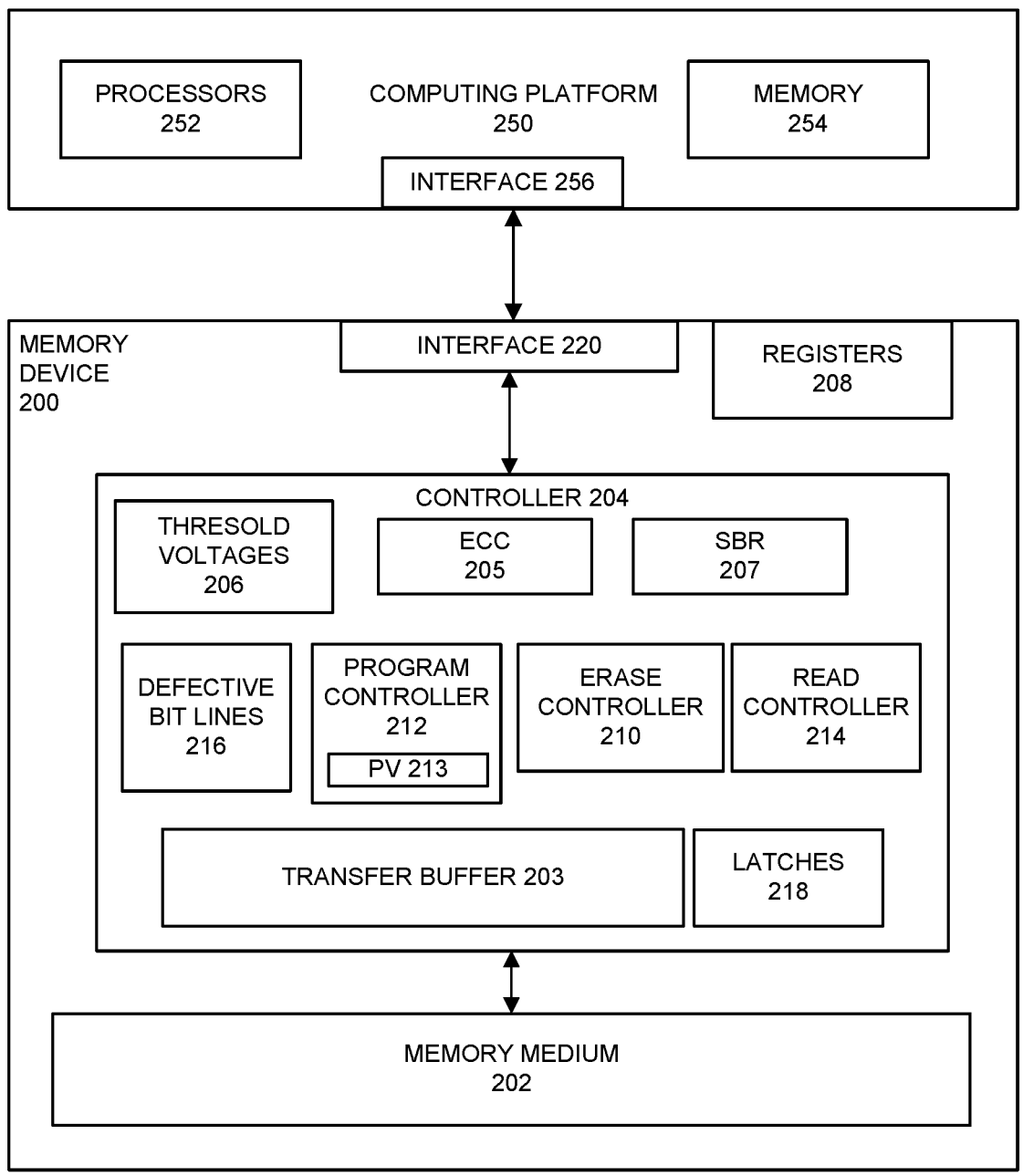
FIG. 2A depicts an example system.

FIG. 2A depicts an example system. Memory device 200 can communicate with computing platform 250 using respective interfaces 220 and 256. Memory medium 202 can be a memory or storage medium that can store one or more bits in memory cells. For example, memory medium 202 can include non-volatile and/or volatile types of memory. Non-volatile types of memory may be types of memory whose state is determinate even if power is interrupted to the device. In some examples, memory medium 202 can be block addressable memory devices, such as NAND or NOR technologies. Memory medium 202 can also include non-volatile types of memory, such as 3D crosspoint memory (3DxP), or other byte addressable non-volatile memory. Memory medium 202 can include memory devices that use chalcogenide phase change material (e.g., chalcogenide glass), multi-threshold level NAND flash memory, NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Memory medium 202 can include a single-level cell (SLC) NAND storage device, a multi-level cell (MLC) NAND storage device, triple-level cells (TLC) NAND storage device, quad-level cells (QLC) storage device.

According to some examples, volatile types of memory included in memory medium 202 can include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM). Volatile types of memory may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

In some examples, memory device 200 can be partitioned into blocks and a block can be sub-divided into pages. In some examples, a page can be a smallest granularity of data that can be addressed by controller 204. For example, a page can be 512, 2048 or 4096 bytes in size, although other sizes can be used.

Controller 204 can be coupled with or configured to couple with a computing platform such as computing platform 250 using interface 220 using an interconnect, network, fabric, or bus. Controller 204 can communicate with elements of computing platform 250 to read data from memory medium 202 or write data to memory medium 202. Controller 204 can be configured to receive commands from computing platform 250 concerning use of memory medium 202 (e.g., read data, write data, indicate error rate). Controller 204 can be coupled to word lines of memory medium 202 to select one of the word lines, apply read voltages, apply program voltages combined with bit line potential levels, or apply erase voltages. Controller 204 can be coupled to bit lines of memory medium 202 to read data stored in the memory cells, determine a state of the memory cells during a program operation, and control potential levels of the bit lines to promote or inhibit programming and erasing. Other circuitry can be used for applying selected read voltages and other signals to memory medium 202.

Controller 204 can include or access transfer buffer 203 to perform an error checking and correction of data already written to memory medium 202 and read from memory medium 202. Transfer buffer 203 can be a volatile memory, such as static random access memory (SRAM). Transfer buffer 203 can include some other type of volatile memory that is different from a SRAM.

In some examples, controller 204 may use error correction code (ECC) 205 for encoding or decoding. For encoding, ECC 205 may include logic and/or features to generate codewords to protect regions of data to be written to memory 202. For decoding, ECC 205 may include logic and/or features to detect and attempt to correct errors included in an ECC encoded region of data. According to some examples, the ECC used to encode the data may include, but is not limited to, a low-density parity-check (LDPC) code, or in some cases, a Reed-Solomon (RS) code or a Bose, Chaudhuri, and Hocquenghem (BCH) code. Error correction code (ECC) can be used to recover data, read and re-read operations applied to memory may be needed to successfully read data. LDPC can use soft decision decoding to decode the data, which could correct errors.

Threshold voltages block 206 can store threshold voltages for cells in memory medium 202 and provide controller 204 with applicable threshold voltages (Vt) to apply to memory cells in memory medium 202 to cause a state of cells to enter one of multiple states. For example, by application of threshold voltages to memory cells in memory medium 202, memory cells are programmed to enter a particular state to store one or more bits.

For an erase operation, cells that belong to a block can be erased by applying an erase pulse with large voltage (e.g., 20V) to the bit lines and then applying a small voltage (e.g., 0V) to the word lines (WLs) (rows) of the selected block while keeping the WLs of unselected blocks floating. The threshold voltage of the cells in the selected block is then compared to an erase verify target. The number of cells with threshold voltage above the erase verify level are then counted to determine a count of bit lines that failed to erase verify. If this count (number) is above a certain fail bit count, another erase pulse typically with higher magnitude is applied. However, use of repeated and increasing erase pulse magnitude with the presence of open bit lines may cause controller 204 to unnecessarily apply a higher erase pulse and cause an over-erase for the rest of the cells. If the number of open bit lines is higher than the maximum allowed fail bit count, controller 204 may report an erase status fail.

In some embodiments, memory controller 204 can be configured to detect defective bit lines associated with a region of memory that is requested to be erased, programmed, or read. In some examples, a command to erase an addressable region of a memory device can cause erase controller 210 to determine defective bit lines before performing an erase and erase verify operation. In some embodiments, prior to applying an erase pulse, erase controller 210 performs a bit line open test by applying a voltage higher than maximum threshold voltage of the cells to all of the WLs of a given block and sensing the BLs. Open BLs will be read as 0, while the rest of the BLs will be read as 1. Erase controller 210 may then count number of the 0s as $N_{open}$ and if there are no open BLs, this number is zero.

After applying the erase pulse, an erase verify operation is typically performed by checking if the threshold voltage of all cells is below an erase verify voltage. Erase controller 210 may then count the number of BLs failing the erase verify, $N_{erase\_fail}$, and compare the number against a predetermined allowed number of erase failing bits. If open bit lines are present and not repaired by mapping them to redundant BLs, they will be identified as failing bits during erase verify. Bit lines that are open always show a high threshold device no matter how many erase verifies are applied and the bits always fail.

During an erase verify, erase controller 210 subtracts the number of open BLs from number of erase failing bits ($N_{erase\_fail}-N_{open}$) and compares ($N_{erase\_fail}-N_{open}$) against a predetermined threshold number of allowed erase failing bits (e.g., based on how many errors are allowed (e.g., 0.1%) and correctable using ECC or soft bit read, for example). If ($N_{erase\_fail}-N_{open}$) is larger than a predetermined allowed number of erase failing bits, erase controller 210 can apply another erase pulse with larger magnitude (less than maximum permitted voltage) and repeat the verify operation. This process is repeated until the number of cells that fail the erase verify is less than a prescribed fail bit count (allowed number of fails) but not considering open bit lines. However, if a maximum number of applied erase voltages has occurred or the erase voltage is a larger magnitude than a maximum permitted voltage, the erase operation is considered a fail.

Various embodiments can identify open BLs for multiple pages and do not determine BL open by application of voltages to word lines in connection with every erase operation. The number of open BLs can be stored in unused latch, register or buffer. After determining a number of open bit lines, the number of open bit lines for a page of memory can be stored and used in future erase operations so that one or more subsequent erase operations to the same page can use the predetermined number of open bit lines.

For program operations, memory controller 204 can use program controller 212 to manage program and program verify operations. In some examples, a command to program an addressable region of a memory device can cause program controller 212 to determine defective bit lines before or in connection with performing a program and program verify operation. For example, to determine defective bit lines, program controller 212 can determine a number of bit lines shorted to another bit line, a gate, or other structure.

In some embodiments, odd numbered BLs are connected to a small voltage (e.g., 0V or ground), while even numbered BLs are pre-charged to a higher voltage (e.g., 0.5V). For example, with respect to FIG. 1, bit line 108A can be considered an even number bit line whereas bit line 108B can be considered an odd numbered bit line. A select gate of the NAND strings is kept turned off (e.g., by grounding the gate of those transistors). With no BL-BL short, there is little current flow and the even numbered BLs will maintain their voltage during develop time of a read operation and are read as 0. Even numbered BLs shorted to their neighboring odd numbered BL or shorted to the select gates will be effectively connected to ground during develop time and are read as 1. Next, even numbered BLs are connected to ground of a small voltage (e.g., 0V) and odd numbered BLs are pre-charged to relatively higher voltage (e.g., 0.5V) and detection of shorted odd numbered BLs occurs in a similar manner as determined for even numbered BLs.

For a program operation, a series of program pulses with increasing magnitude is applied to the selected word line (WL) that corresponds to the page address to be programmed. For example, a three-level-per cell (TLC) NAND, memory cells may be programmed to one of the eight possible threshold voltage levels L0 to L7 according to the corresponding bits from three pages of the data provided to the NAND. For TLC NAND devices, after each program pulse, the threshold voltage of the cells are compared against a set of program verify voltages (PV1 to PVn, where n is 0 to 7) based on the level the corresponding BLs are programmed to. For MLC or SLC NAND memory devices, respective 4 and 2 levels of program verify voltages are used. Other levels of threshold distribution are supported, including QLC. BLs with threshold voltage higher than the corresponding PV can be marked as inhibit whereas BLs with threshold voltage lower than PV remain in the program bucket and are considered programmed.

According to some embodiments, shorted BLs are identified at the beginning of a program sequence (or prior to applying a program signal) and are marked inhibited prior to applying the first program pulse. In some embodiments, for defective (shorted) BLs, controller 204 may set the corresponding latch 218 that maintains the inhibit information to 1 (not programmed) prior to applying a first program pulse. In some embodiments, controller 204 may modify the data to be programmed for the defective BLs to put them in L0 state (e.g. by setting all data latches 218 corresponding to defective BLs to 1). The rest of the program is then performed by applying program pulses to the selected WL and then verifying the threshold voltage of uninhibited cells against a specified set of verify voltages.

Program controller 212 can identify shorted bit line(s) for multiple pages and not determine the shorted bit line(s) before every program operation. After determining shorted bit lines for a page, the number of shorted bit lines for a page of memory can be stored and used in future program operations so that one or more subsequent program operations to the same page can use the predetermined number of shorted bit lines. In some embodiments, the procedure to identify shorted BLs is applied at the beginning of program operation of all pages. In some embodiments, the procedure to identify short BLs may be applied once per a group of pages, for example for all pages that belong to a given block, and the information is maintained in some temporary location for example in some of the latches or SRAM locations that hold the page buffer data. Program operations that share the short BL information can then retrieve this information from the latches or SRAM locations and update the inhibit information prior to applying the first program pulse.

During a subsequent program pulse, inhibited BLs receive a relatively large voltage (e.g., Vcc) while BLs to be programmed receive a relatively small voltage (e.g., 0V). Additionally, BLs whose threshold voltage has not passed the corresponding PV but are close may be identified during verify and receive an intermediate voltage (e.g., 1V) during the subsequent program pulse (e.g., using selective slow program convergence (SSPC)).

Program controller 212 can reduce the number of passing bit lines by a number of shorted bit lines and compare the reduced number of passing bit lines against a threshold level to determine if the number of passing bit lines is acceptable for a relevant level (e.g., L0 to L7 for TLC, or L0 to L3 for MLC, and so forth). If an adjusted number of bit line fails is larger than an allowed number of fails, a gate voltage is increased and a program and program verify are repeated until a threshold number of BLs pass their corresponding PV, a maximum allowed number of program loops is met, or a maximum program pulse magnitude is reached. If a threshold number of bit lines pass their PV within a maximum allowed number of program loops and within a maximum program pulse magnitude, program controller 212 identifies the program operation as a pass. If a maximum allowed number of program retries is met or a maximum program pulse magnitude is reached without a threshold number of BLs passing their corresponding PV, program controller 212 identifies the program operation as a fail.

In some embodiments, program controller 212 can determine a starting program voltage magnitude to use for a page of memory based on a number of open bit lines. A program scheme may contain routines to automatically adjust the starting program pulse amplitude. Changing the starting program voltage magnitude can compensate for variation in the optimum program start voltage between different WLs or to compensate for the changes over cycling or time and memory device use. A voltage magnitude may be calculated for a sample page from a set of pages that share the same WL. The remaining pages then may use an optimum start program voltage calculated based on how the threshold voltage of the cells in the sampling page responded to the program pulses.

Program controller 212 can determine a program voltage for a page at which the number of passing bit lines reduced by a number of open bit lines is at or above a threshold accepted level of passing bit lines and store the determined program voltage in program voltage (PV) 213. Program voltage 213 can store a default starting program voltage and be overwritten with the determined program voltage. To determine the program voltage, program controller 212 can continue to a program voltage level until the number of passing bit lines reduced by a number of open bit lines is at or above a threshold accepted level of passing bit lines except that the program voltage level cannot exceed a maximum and a number of times the program voltage level increases is capped. If the number of passing bit lines reduced by a number of open bit lines does not meet the threshold accepted level of passing bit lines before the program voltage level meets a maximum or a number of times the program voltage level meets a cap, a default program voltage is used.

Memory controller 204 can use read controller 214 to perform a read request to a region of memory such as a page of memory. The read request can return results from the read and in some cases, soft bit read (SBR) 207 is used to correct for errors in data. For read data needing correction using error correction coding, read controller 214 can determine whether particular read data where reading involved use of bit lines that are open or shorted bit lines and identify the read data involved bit lines that are open or shorted bit lines as "weak" 0 values in connection with use in soft bit read error correction to avoid overconfidence in the read data values. Soft bit read 207 can perform one or more of: reading the data multiple times via multiple strobes, obtaining reliability information, and mapping a log likelihood radio (LLR) corresponding value.

Figure 2B:
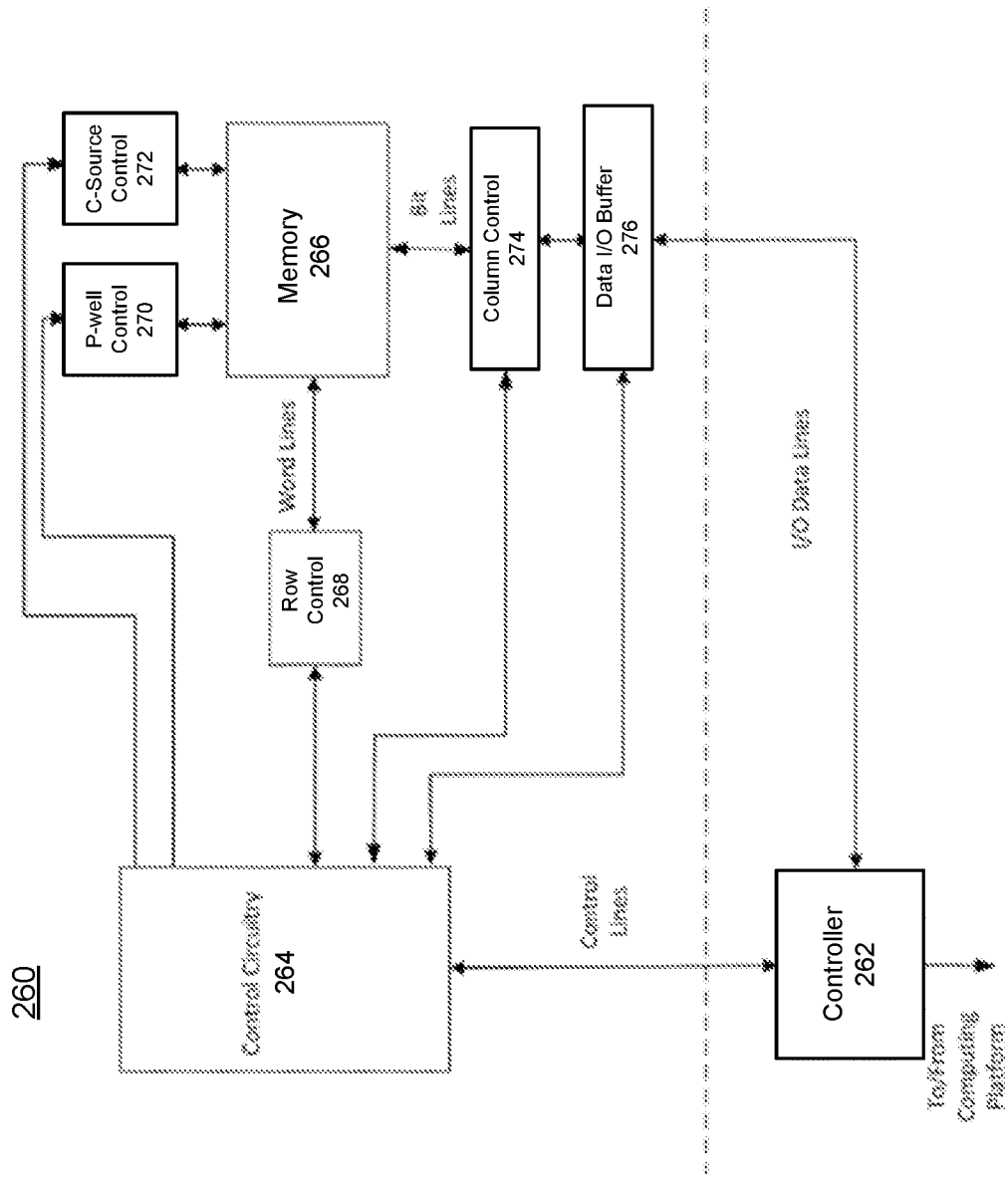
FIG. 2B illustrates a diagram of an example memory system.

FIG. 2B illustrates a diagram of an example memory system 260. Memory system 260 may include a controller 262, control circuitry 264, and a memory array 266. In some examples, various memory operations performed by memory array 266 may be controlled by row control 268, p-well control 270, c-source control 272 and column control 274. Overall operations of memory array 266 may be controlled or directed by controller 262 and/or control circuitry 264. A data input/output buffer 276 may be configured to at least temporarily store data written to or read from memory array 266.

In some examples, memory array 266 may include a non-volatile type of memory and/or a volatile type of memory listed or not listed herein. According to some examples, row control 268 may be coupled to word lines of memory array 266. For these examples, row control 268 may be coupled via the word lines to select one of the word lines, apply read voltages, apply program voltages combined with bit line potential levels controlled by column control 274, and apply erase voltages. Also, column control 274 may be coupled to bit lines of memory array 266 to read data stored in the memory cells, determine a state of the memory cells during a program operation, and control potential levels of the bit lines to promote or inhibit programming and erasing. P-well control 270 may control the p-well voltage of memory array 266 and c-source control 272 may control a common source line coupled to memory array 266. Other circuitry can be used for applying selected read voltages and other signals to memory array 266.

In some examples, column control 274 may be configured to read out data stored or maintained in memory array 266 and the data may be output to external I/O data lines via data I/O buffer 276. For these examples, program data to be stored in the memory cells of memory array 266 may be input to data I/O buffer 276 via the external I/O data lines and then transferred to column control 274. As shown in FIG. 2B, in some examples, the external I/O data lines may be coupled to or managed by controller 262.

According to some examples, command data for controlling elements of memory system 260 such as memory array 266 may be relayed from controller 262 via control lines coupled to control circuitry 264. The control data, for examples, may inform the elements of memory system 260 as to what operation is requested.

In some examples, controller 262 may be coupled with or configured to couple with a host system such as a computing platform or computing device with processors, accelerator devices, and so forth. Controller 262 may communicate with elements of the computing platform to read data from or write data to memory array 266. Controller 262 may be configured to receive commands from the computing platform and forward the commands to control circuitry 264. Controller 262 may also be configured to control I/O data lines between memory system 260 and the computing platform.

According to some examples, memory system 260 may be incorporated as an integrated system that includes controller 262 on a single circuit board or other type of integrated packaging. For these examples, the integrated system may include a plurality of memory array 266 and associated control circuitry. The integrated system may be embedded as part of a computing platform or may be included in a type of configuration that may be removably coupled to a computing platform. This type of configuration may include all of the elements of memory system 260 depicted in FIG. 2B or just the elements above the dotted-line shown in FIG. 2B. Controller 262 may therefore be embedded with the computing platform or may be included in a memory system that is removable from the computing platform.

FIG. 3 shows a schematic representation of a distribution of the cell threshold voltages for a Tri-Level Cell (TLC) NAND flash memory. For cells connected to open bit lines, a portion of a threshold voltage distribution extends to the right and beyond voltage level Rmax. For example, threshold voltage distributions of cells in levels L0, L2, L5 and L7 exhibit distributions beyond Rmax because of open bit lines. In some embodiments, a sense operation with word lines set to Rmax, that is substantially higher than the threshold voltage of non-defective cells, can be used to detect open BLs.

Figure 4:
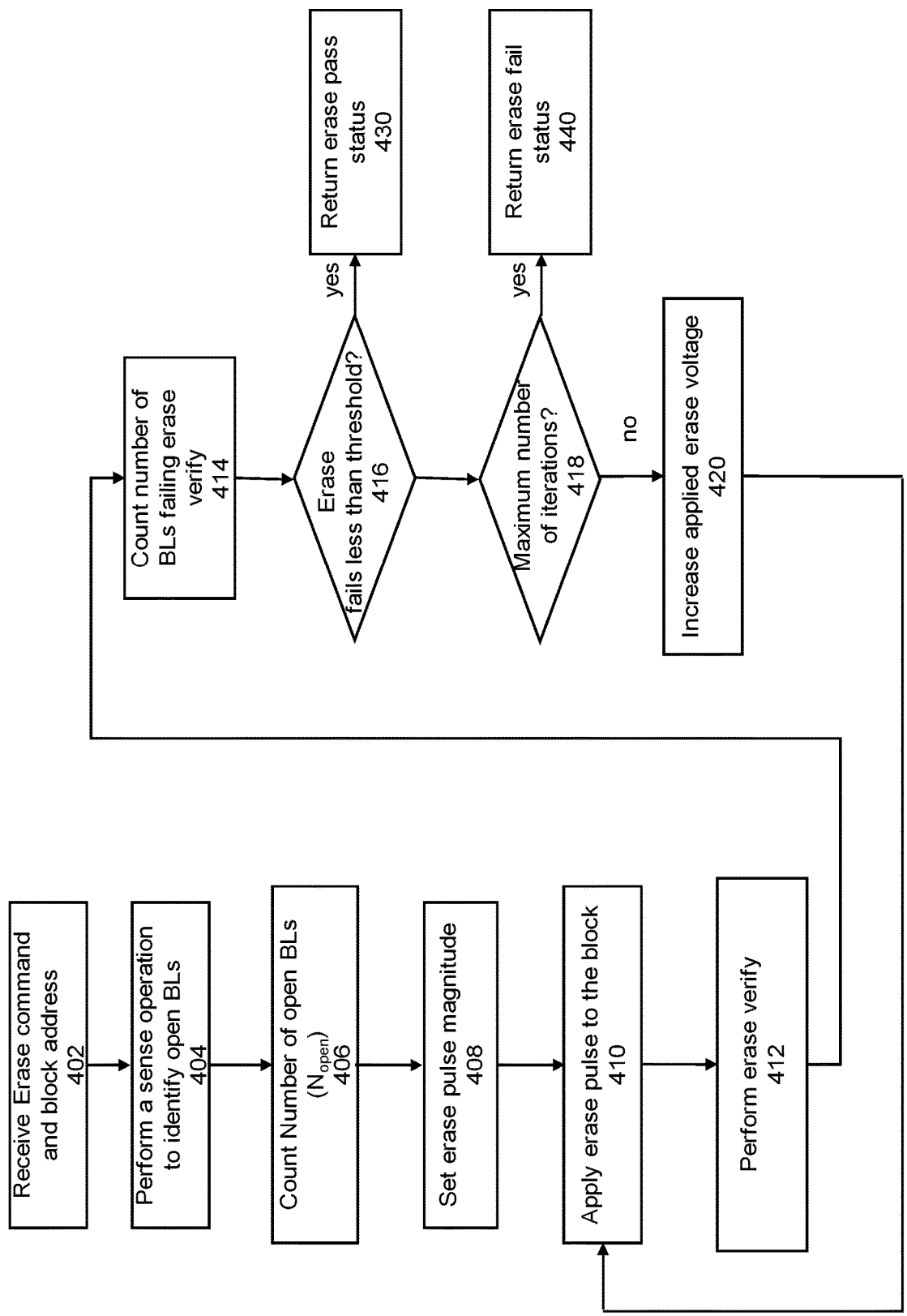
FIG. 4 shows a process of an erase operation with an open bit line check procedure.

FIG. 4 shows a process of an erase operation with an open bit line check procedure. The process can be performed by a memory controller, for example. At 402, an erase command and associated block or addressable region of memory is received at a memory controller. The erase command can be received from a host system that is locally or remotely connected to the memory system through a network, fabric, interconnect, or bus. At 404, a sense operation is performed to identify open bit lines (BLs). For example, identifying open bit lines can include applying a voltage higher than maximum threshold voltage of the cells to all of the WLs of a given block and sensing the BLs. Open BLs will be read as 0, while the erased BLs will be read as 1. At 406, a number of open bit lines (BLs) is counted.

At 408, an erase pulse magnitude can be set. For example, a starting erase voltage configured in a memory controller can be used as the erase pulse magnitude. At 410, the erase voltage can be applied to the block or other region of memory associated with the erase command. At 412, an erase verify operation is performed for the block or region of memory. An erase verify can include verifying that at least a threshold number of cells have a threshold voltage ($V_{TH}$) less than an erase verify voltage ($V_{erase\_verify}$).

At 414, a number of bit lines failing erase verify ($N_{erase\_fail}$) is determined. For example, the number of bit lines failing erase verify can be associated with cells with a threshold voltage ($V_{TH}$) larger than an erase verify voltage ($V_{erase\_verify}$). At 416, a determination is made if an adjusted number of bit lines failing erase verify is less than or equal to a threshold. The adjusted number of bit lines failing erase verify can be a number of bit lines failing erase verify reduced by a number of open bit lines. If the adjusted number of bit lines failing erase verify is less than a threshold, at 430, an erase pass status is determined in response to the erase command. The erase pass status can be provided to a host system for example. If an adjusted number of bit lines failing erase verify is equal to or more than a threshold, 418 follows.

At 418, a determination is made if a maximum number of iterations of applied erase pulses with erase verifies has been performed. If a maximum number of iterations of applied erase pulses with erase verifies has been performed, at 440, an erase fail status is made. The erase fail status can be provided to a host system or requester of an erase operation. If less than a maximum number of iterations of applied erase pulses with erase verifies has been performed, then 420 follows. In some embodiments, 418 can include a determination if an applied erase voltage, if increased to a next level, would be at or higher than a threshold. If the increased applied erase voltage would be at or higher than a threshold, then 440 can follow. If the increased applied erase voltage would not be at a threshold and not higher than a threshold, then 410 can follow with the increased applied erase voltage applied in 420.

At 420, a magnitude of erase voltage is increased by a programmed incremental value and 410 is performed again with the increased erase voltage magnitude.

Figure 5:
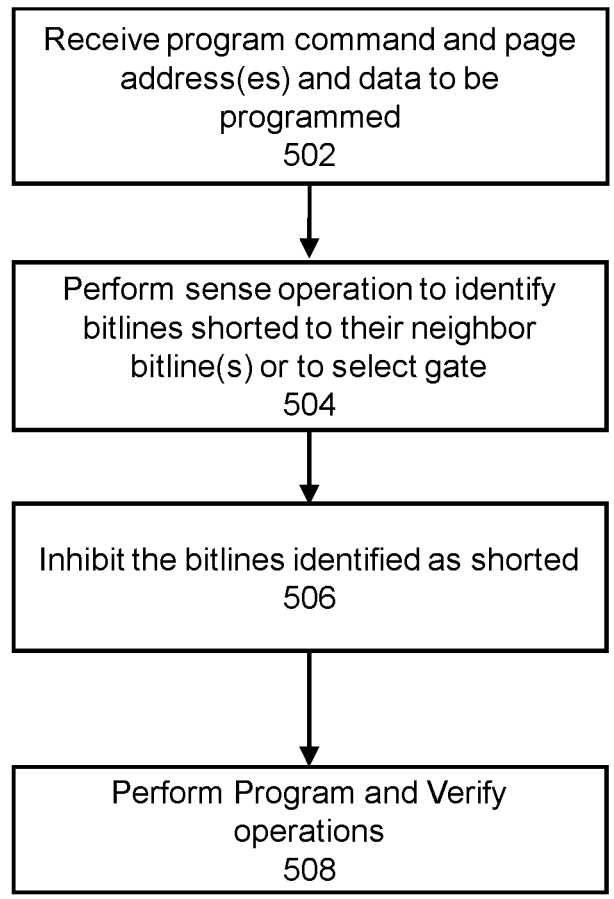
FIG. 5 depicts a process to perform a program and program verify operation.

FIG. 5 depicts a process to perform a program and program verify operation that considers defective bit lines. A memory controller can perform the process of FIG. 5. The process can be used to identify a number or specific bit lines that are shorted to one or more other bit lines or a gate (or other structure) and to take into account the number of bit lines that are shorted in determining whether a program has failed or succeeded. At 502, a program command and associated address and data can be received. An address can specify a page or other region of memory. The program command can be received from a local or remote device. At 504, a sense operation can be performed to identify bit lines shorted to another bit line or a select gate or other structure.

For example, to identify bit lines that are shorted, the following technique can be used. In some embodiments, odd numbered BLs are connected to a small voltage such as ground, while even numbered BLs are precharged to a higher voltage such as 0.5V. A select gate of the NAND strings is kept turned off, e.g. by grounding the gate of those transistors. With no BL-BL short, there is little current flow, and the even numbered BLs will maintain their voltage during develop time of a read algorithm and hence are read as 0. Even numbered BLs shorted to their neighboring odd numbered BL or shorted to the select gates will be effectively connected to ground during develop time and are read as 1. Next, even numbered BLs are connected to a small voltage such as ground and odd numbered BLs are precharged to relatively higher voltage such as 0.5V and are sensed to detect shorted odd numbered BLs in a similar manner as determined for even numbered BLs.

At 506, bit lines identified as shorted can be inhibited. For example, inhibiting a bit line can include applying a relatively large voltage such as Vcc to an inhibited bit line. At 508, program and program verify operations can be performed for non-inhibited bit lines. A program operation can include applying a program voltage pulse with a magnitude set by a memory controller. A program verify operation can include determining a number of cells whose threshold voltage exceeds a program verify voltage level. In some examples, program and program verify operations are repeated with increasing magnitude of program voltage pulse until a threshold number of bit lines are verified to be programmed. But if a program voltage pulse magnitude reaches a level that is at or above a threshold or a peak number of repeats/retries is reached, a program fail is determined.

Figure 6:
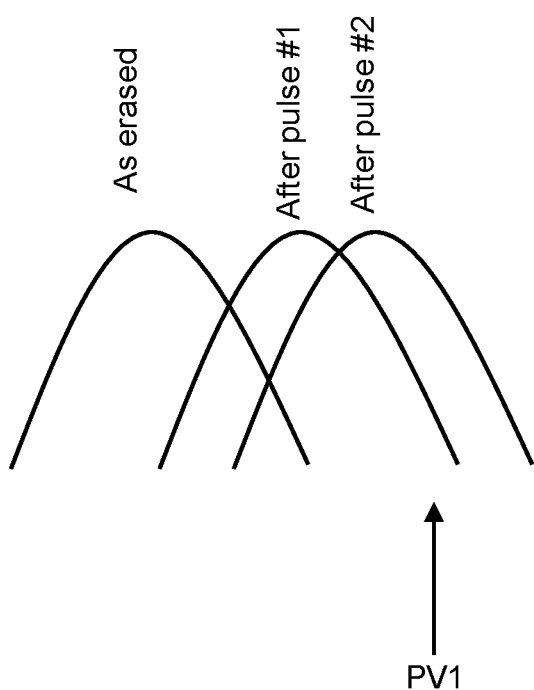
FIG. 6 shows a schematic representation of how threshold voltage of cells can progress during repeated applied program pulses.

FIG. 6 shows a schematic representation of how threshold voltage of cells can progress during repeated applied program pulses. A set of program pulses with increasing magnitude are applied to a selected WL, and the threshold voltage of cells is compared against a verify level such as PV1, a number of cells is counted that passed PV1. In the presence of open BLs, a number of iterations/repeated applied programming pulses can be high and result in a conservative calculation of a starting program voltage magnitude.

Figure 7:
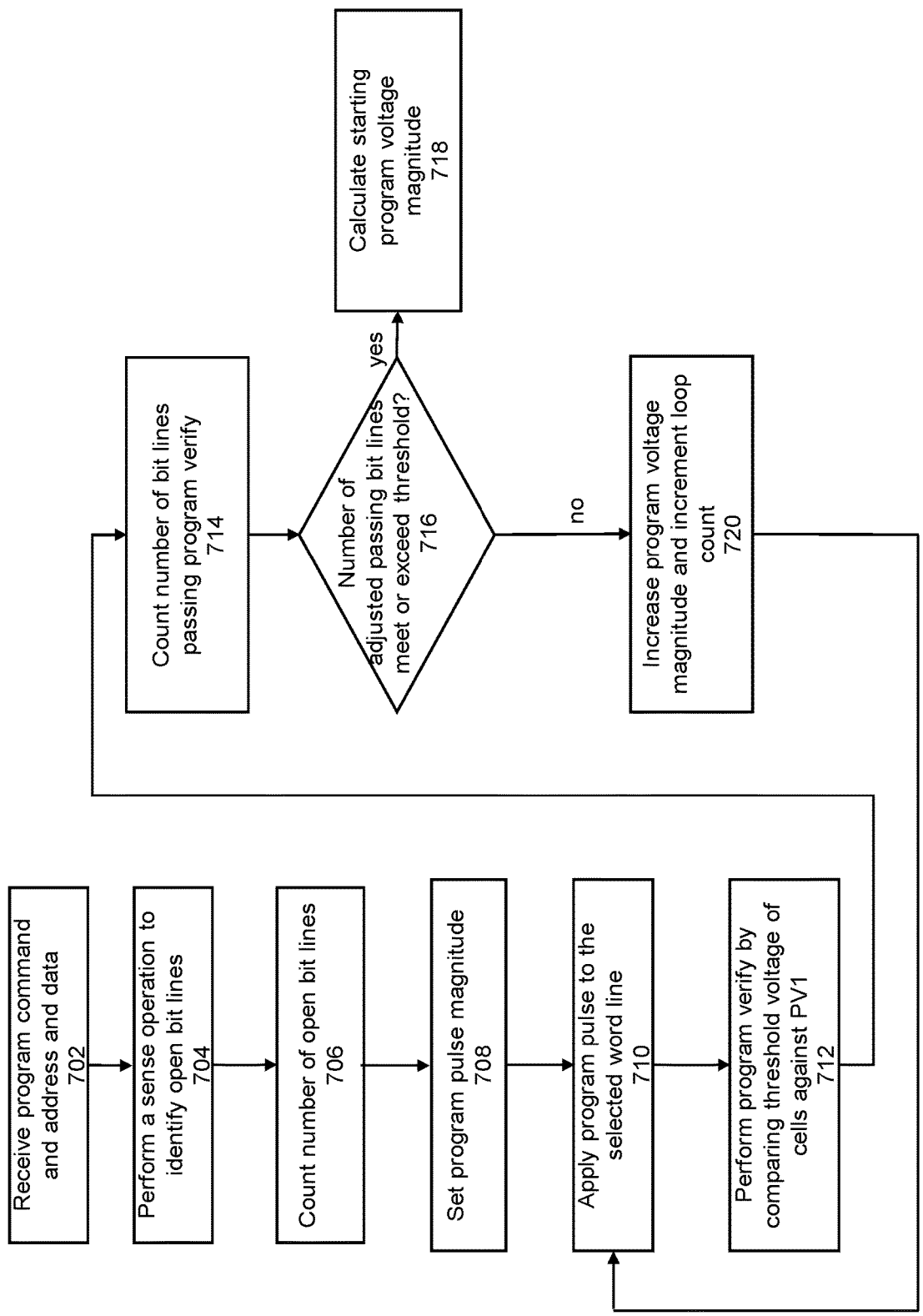
FIG. 7 shows a process to account for a number of open BLs when calculating an initial program voltage magnitude.

FIG. 7 shows a process to account for a number of open BLs when calculating an initial program voltage magnitude. The process can be performed by a memory controller coupled to a memory device. The process can be performed in a factory or manufacturing facility before the memory system is released to a user, for example. The process can be performed in an operational memory system after use by a customer. At 702, a program command can be received with an address and associated data. An address can specify a page or other region. The program command can be received from a local or remote computing system. At 704, a sense operation can be performed to identify a number of open bit lines. For example, identifying a number of open bit lines can be similar to 404 (FIG. 4). At 706, a number of open bit lines can be counted. For example, counting open bit lines can be similar to 406 (FIG. 4). In some examples, 404 and 406 are performed in an erase operation prior to performing a program operation and number of open bit lines are stored for use in a program operation and actions 704 and 706 are replaced with reading a number of open bit lines from storage or memory.

At 708, a program pulse magnitude can be set using a starting program amplitude. The starting program amplitude can be a default program voltage value used by a memory controller. A starting program voltage can be a default voltage level set by a manufacturer or the host. At 710, a program pulse with the starting program voltage amplitude can be applied to a selected word line associated with the address associated with the program command.

At 712, a program verify operation can be performed. A threshold voltage of cells attempted to be programmed can be compared against program verify level (PV1). At 714, a count of a number of bit lines passing program verify level is determined. Each cell to be programmed can be connected to a corresponding bit line so that a number of cells that pass the program verify correspond to the number of bit lines. At 716, a determination is made as to whether a number of adjusted passing bit lines meets or exceeds a threshold number. A number of adjusted passing bit lines can be number of passing bit lines less number of determined open bit lines. If the number of adjusted passing bit lines meets or exceeds a threshold, the program can be considered a pass and 718 follows. If the number of adjusted passing bit lines does not meet and does not exceed the threshold level, then 720 can follow.

At 718, a determination is made of a program voltage magnitude to apply in a next iteration of 708. For example, a next iteration of 708 can occur for programming another page that shares the same WL. The calculated (or determined) program started program voltage can be the program pulse magnitude that resulted in the adjusted number of passing bit lines meeting or exceeding the threshold number. This program voltage can be stored for use in a subsequent program operation as an initial program pulse magnitude to attempt to reduce a time taken to program a region of memory.

At 720, the program voltage magnitude can be increased and a loop count can be incremented. Action 710 can be performed again after action 720 but using an increased program voltage magnitude.

As long as the number of bad columns, e.g. short or open BLs is relatively small compared to error correction code (ECC) capability, the extra raw bit error rate (RBER) associated with bad columns can be ignored. Memory systems, however, often use soft read information to provide higher correction capability. In such cases, a memory device receives a special read command to perform a soft read operation. The memory device performs extra sensing operations at a series of voltages close to and centered around the reference read voltage. The read result for the cells with threshold voltage close to the reference voltage will flip between the series of read operations. Such cells are read as "weak" 0 or 1 states. By contrast, read results of cells with threshold voltage far away from the reference voltage do not flip between the series of read operations and such cells are read as "strong" 0 of 1 states.

Figure 8:
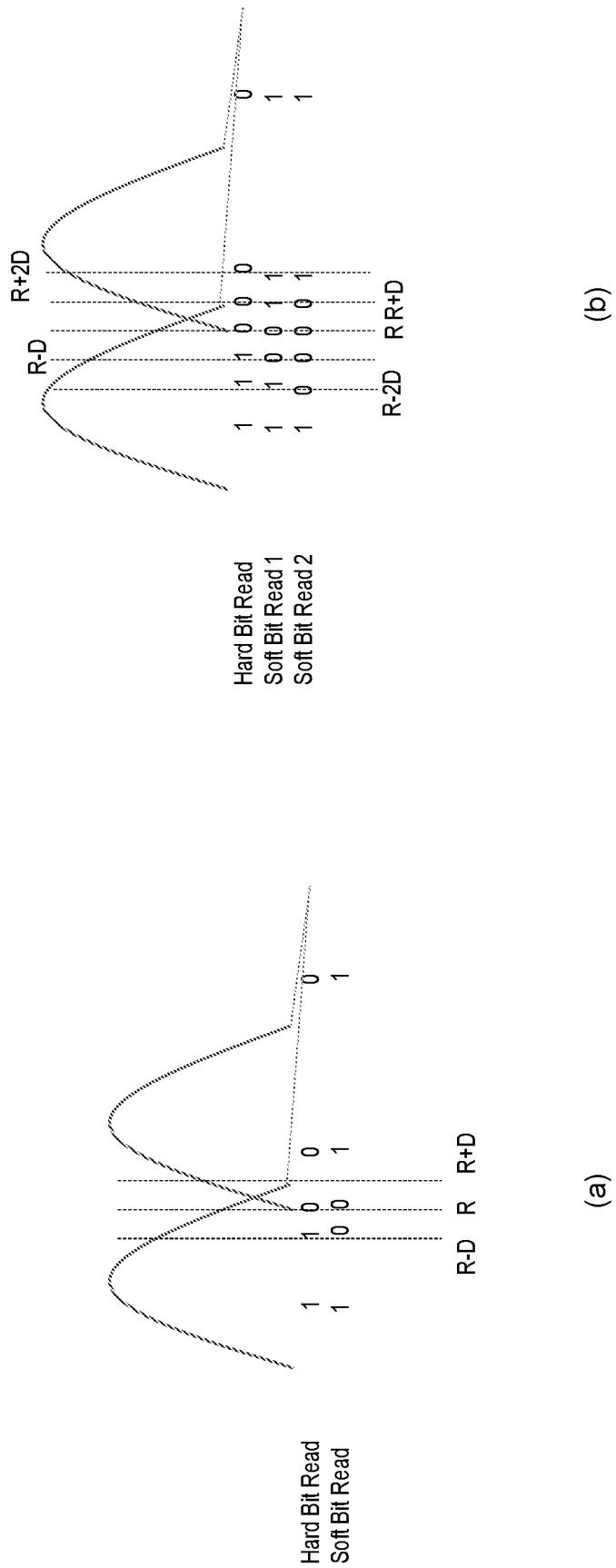
FIG. 8 shows an example of threshold voltage distribution of cells and the read operations in 3-strobe (shown as (a)) and 5-strobe soft read operations (shown as (b)).

FIG. 8 shows an example of threshold voltage distribution of cells and the read operations in 3-strobe (shown as (a)) and 5-strobe soft read operations (shown as (b)). Tails pointing to the right are caused by an open bit line (0). A tail is shown as a "strong" zero because the threshold voltage is to the right of voltage R+Δ (shown as R+D). In the absence of column repair, data read using defective columns may be incorrectly marked as "strong" bits. Since these bits maybe completely incorrect, passing the information to the ECC engine as strong 0s or 1s may significantly degrade error correction capability.

In an example 3-strobe soft read, for every read reference, three read operations are performed for example at an offset delta (Δ) below and offset delta (Δ) above the reference level R. In the example, cells with threshold voltage below R are read as 1 and cells with threshold voltage above R are read as 0 to generate hard bit read (HBR) data. Cells with threshold voltages between R−Δ (R−D) and R+Δ (R+D) are marked as weak bits, denoted by 0 in soft bit read (SBR) data. Cells with threshold voltages blow R−Δ or above R+Δ are marked as strong cells, denoted by 1 in SBR data.

In a 5-strobe soft read, two more read operations occur, for example at R−2Δ (R−2D) and R+2Δ (R+2D). Cells with threshold voltages between R−2Δ and R−Δ and R+Δ and R+2Δ are marked somewhere between weak and strong 0s and 1s and this information is encoded by a second soft bit (SBR) data.

Figure 9:
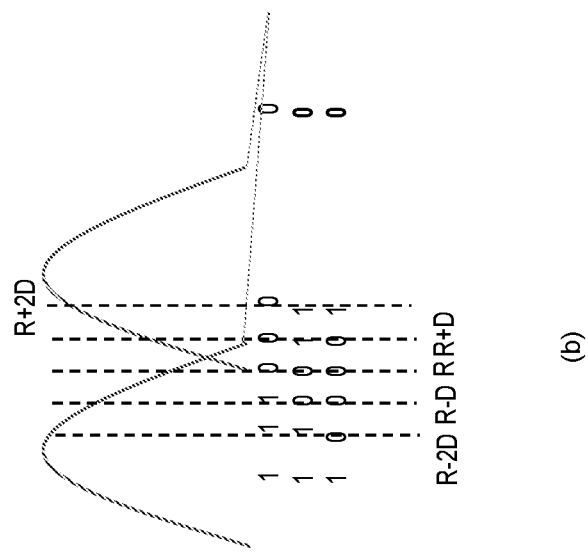
FIG. 9 shows a schematic representation of a threshold voltage distribution and read operations to determine soft bit information with a (a) 3-strobe and (b) 5-strobe SBR.
Figure 9:
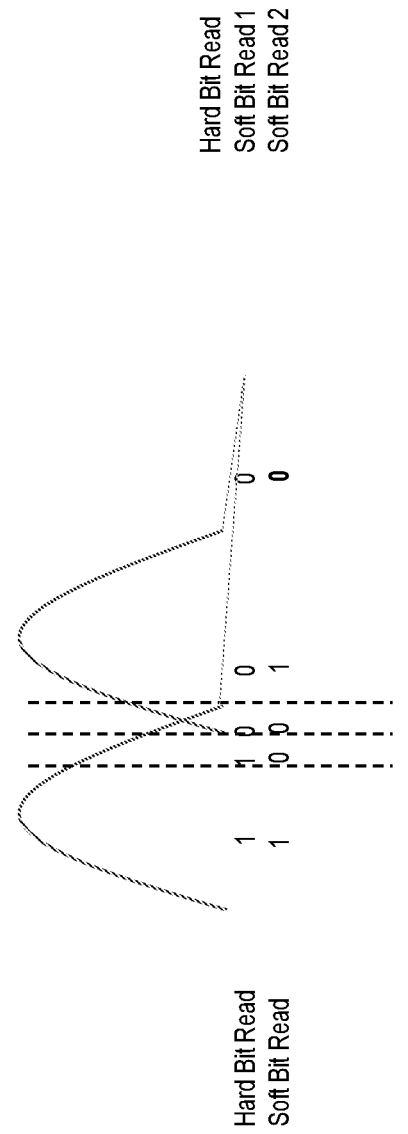

FIG. 9 shows a schematic representation of a threshold voltage distribution and read operations to determine soft bit information with a (a) 3-strobe and (b) 5-strobe SBR. According to some embodiment, the memory device (or its memory controller) may perform a read operation and identify defective columns (e.g., open or short BLs (as part of read operation)) and identify data retrieved using defective columns as "weak" category data in a soft bit read (SBR). In accordance with some embodiments, data read using open bit lines are marked as "weak" 0 in the SBR data.

According to some embodiments, a BL check may be performed as a part of SBR operation to identify BLs shorted to their neighbors or to the select gate transistor (or other structures) and data read using these identified BLs are put in the "weak" bucket by marking the corresponding SBR data to "weak" 0.

Figure 10:
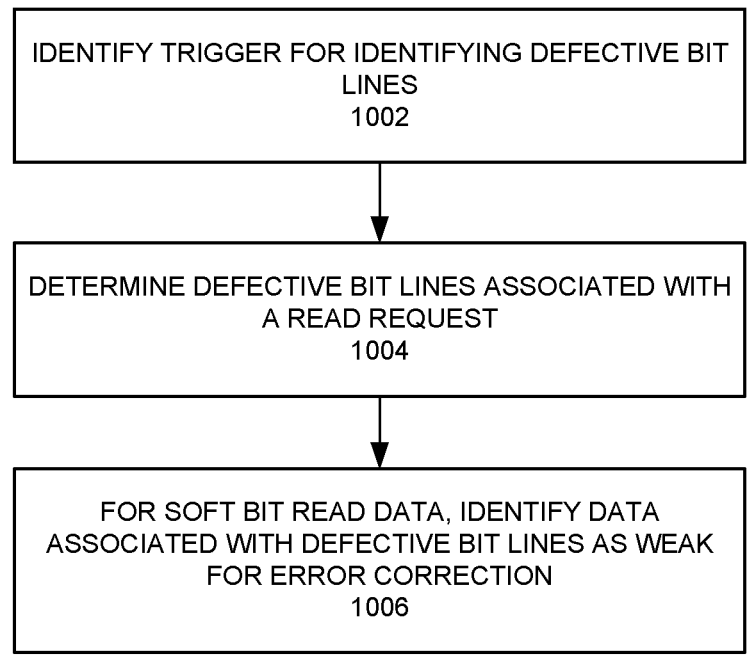
FIG. 10 depicts a process that can be used to identify weak data for soft bit read correction.

FIG. 10 depicts a process that can be used to identify weak data for soft bit read correction. At 1002, a trigger for determining defective bit lines is identified. The trigger can be a read request or a request to perform a soft bit read operation to correct data retrieved from defective or potentially defective memory cells or memory cells with defective bit lines or word lines.

At 1004, defective bit lines are detected. In some embodiments, open bit lines can be identified as part of a read operation by applying a voltage higher than maximum threshold voltage of the cells to all of the word lines of a given block and sensing the bit lines. Open BLs will be read as 0. Bit lines can be identified as shorted to other structures (e.g., bit lines, gates, or other structures) using 504 of FIG. 5. In some examples, where open or short bit lines are identified, a table can be accessed to identify both open and short bit lines and data retrieved using an open or short bit line can be identified as a weak "0".

At 1006, for soft bit read data, data read using a defective bit line is identified as weak for error correction. Thereafter, soft bit read correction can take place to attempt to correct data read using defective bit line(s).

Figure 11:
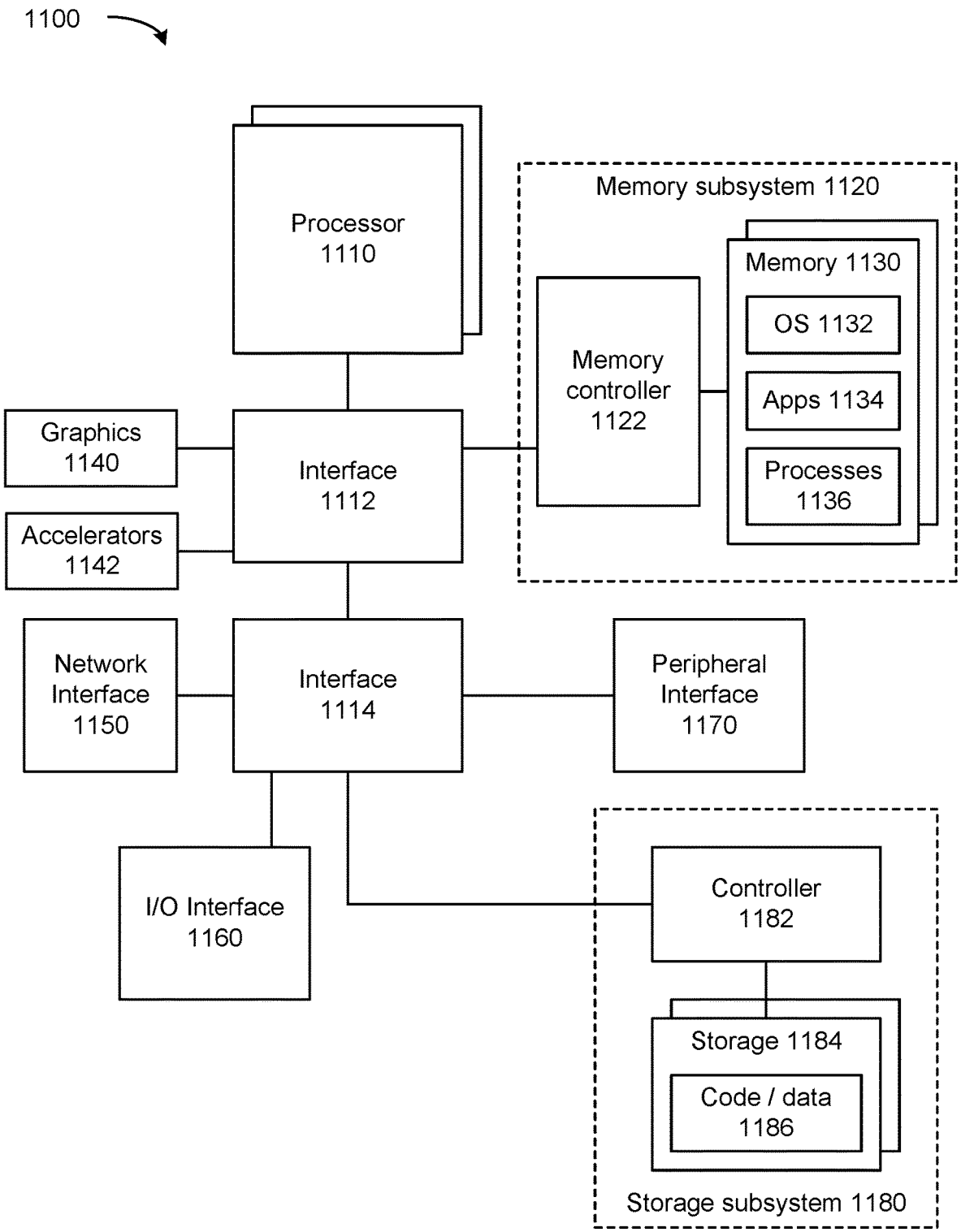
FIG. 11 depicts a system.

FIG. 11 depicts a system. The system can use embodiments described herein to erase, program, or read data in a local or remote memory system. System 1100 includes processor 1110, which provides processing, operation management, and execution of instructions for system 1100. Processor 1110 can include any type of microprocessor, central processing unit (CPU), graphics processing unit (GPU), processing core, or other processing hardware to provide processing for system 1100, or a combination of processors. Processor 1110 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1100 includes interface 1112 coupled to processor 1110, which can represent a higher speed interface or a high throughput interface for system components that needs higher bandwidth connections, such as memory subsystem 1120 or graphics interface components 1140, or accelerators 1142. Interface 1112 represents an interface circuit, which can be a standalone component or integrated onto a processor die. Where present, graphics interface 440 interfaces to graphics components for providing a visual display to a user of system 1100. In one example, graphics interface 1140 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1140 generates a display based on data stored in memory 1130 or based on operations executed by processor 1110 or both. In one example, graphics interface 1140 generates a display based on data stored in memory 1130 or based on operations executed by processor 1110 or both.

Accelerators 1142 can be a fixed function offload engine that can be accessed or used by a processor 1110. For example, an accelerator among accelerators 1142 can provide compression (DC) capability, cryptography services such as public key encryption (PKE), cipher, hash/authentication capabilities, decryption, or other capabilities or services. In some embodiments, in addition or alternatively, an accelerator among accelerators 1142 provides field select controller capabilities as described herein. In some cases, accelerators 1142 can be integrated into a CPU socket (e.g., a connector to a motherboard or circuit board that includes a CPU and provides an electrical interface with the CPU). For example, accelerators 1142 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 1142 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1120 represents the main memory of system 1100 and provides storage for code to be executed by processor 1110, or data values to be used in executing a routine. Memory subsystem 1120 can include one or more memory devices 1130 such as read-only memory (ROM), flash memory, one or more varieties of random access memory (RAM) such as DRAM, or other memory devices, or a combination of such devices. Memory 1130 stores and hosts, among other things, operating system (OS) 1132 to provide a software platform for execution of instructions in system 1100. Additionally, applications 1134 can execute on the software platform of OS 1132 from memory 1130. Applications 1134 represent programs that have their own operational logic to perform execution of one or more functions. Processes 1136 represent agents or routines that provide auxiliary functions to OS 1132 or one or more applications 1134 or a combination. OS 1132, applications 1134, and processes 1136 provide software logic to provide functions for system 1100. In one example, memory subsystem 1120 includes memory controller 1122, which is a memory controller to generate and issue commands to memory 1130. It will be understood that memory controller 1122 could be a physical part of processor 1110 or a physical part of interface 1112. For example, memory controller 1122 can be an integrated memory controller, integrated onto a circuit with processor 1110.

While not specifically illustrated, it will be understood that system 1100 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 1100 includes interface 1114, which can be coupled to interface 1112. In one example, interface 1114 represents an interface circuit, which can include standalone components and integrated circuitry. In one example, multiple user interface components or peripheral components, or both, couple to interface 1114. Network interface 1150 provides system 1100 the ability to communicate with remote devices (e.g., servers or other computing devices) over one or more networks. Network interface 1150 can include an Ethernet adapter, wireless interconnection components, cellular network interconnection components, USB (universal serial bus), or other wired or wireless standards-based or proprietary interfaces. Network interface 1150 can transmit data to a device that is in the same data center or rack or a remote device, which can include sending data stored in memory. Network interface 1150 can receive data from a remote device, which can include storing received data into memory. Various embodiments can be used in connection with network interface 1150, processor 1110, and memory subsystem 1120.

In one example, system 1100 includes one or more input/output (I/O) interface(s) 1160. I/O interface 1160 can include one or more interface components through which a user interacts with system 1100 (e.g., audio, alphanumeric, tactile/touch, or other interfacing). Peripheral interface 1170 can include any hardware interface not specifically mentioned above. Peripherals refer generally to devices that connect dependently to system 1100. A dependent connection is one where system 1100 provides the software platform or hardware platform or both on which operation executes, and with which a user interacts.

In one example, system 1100 includes storage subsystem 1180 to store data in a nonvolatile manner. In one example, in certain system implementations, at least certain components of storage 1180 can overlap with components of memory subsystem 1120. Storage subsystem 1180 includes storage device(s) 1184, which can be or include any conventional medium for storing large amounts of data in a nonvolatile manner, such as one or more magnetic, solid state, or optical based disks, or a combination. Storage 1184 holds code or instructions and data 1186 in a persistent state (i.e., the value is retained despite interruption of power to system 1100). Storage 1184 can be generically considered to be a "memory," although memory 1130 is typically the executing or operating memory to provide instructions to processor 1110. Whereas storage 1184 is nonvolatile, memory 1130 can include volatile memory (i.e., the value or state of the data is indeterminate if power is interrupted to system 1100). In one example, storage subsystem 1180 includes controller 1182 to interface with storage 1184. In one example controller 1182 is a physical part of interface 1114 or processor 1110 or can include circuits or logic in both processor 1110 and interface 1114.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version 3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2

(HBM version 2), currently in discussion by JEDEC, or others or combinations of memory technologies, and technologies based on derivatives or extensions of such specifications. The JEDEC standards are available at www.jedec.org.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1100. More specifically, power source typically interfaces to one or multiple power supplies in system 1100 to provide power to the components of system 1100. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1100 can be implemented using interconnected compute sleds of processors, memories, storages, network interfaces, and other components. High speed interconnects can be used such as compatible at least with Ethernet, PCIe, Intel QuickPath Interconnect (QPI), Intel Ultra Path Interconnect (UPI), Intel On-Chip System Fabric (IOSF), Omnipath, Compute Express Link (CXL), Hyper-Transport, high-speed fabric, NVLink, Advanced Microcontroller Bus Architecture (AMBA) interconnect, OpenCAPI, Gen-Z, CCIX, 3GPP Long Term Evolution (LTE) (4G), 3GPP 5G, and variations thereof. Communications can be compatible with remote direct memory access (RDMA), InfiniBand, Internet Wide Area RDMA Protocol (iWARP), quick UDP Internet Connections (QUIC), or RDMA over Converged Ethernet (RoCE). Data and logs can be stored and accessed using virtualized storage nodes using a protocol such as NVMe over Fabrics (NVMe-oF).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (i.e., buses) for coupling appropriate integrated circuits (ICs) and other components mounted to the board.

Figure 12:
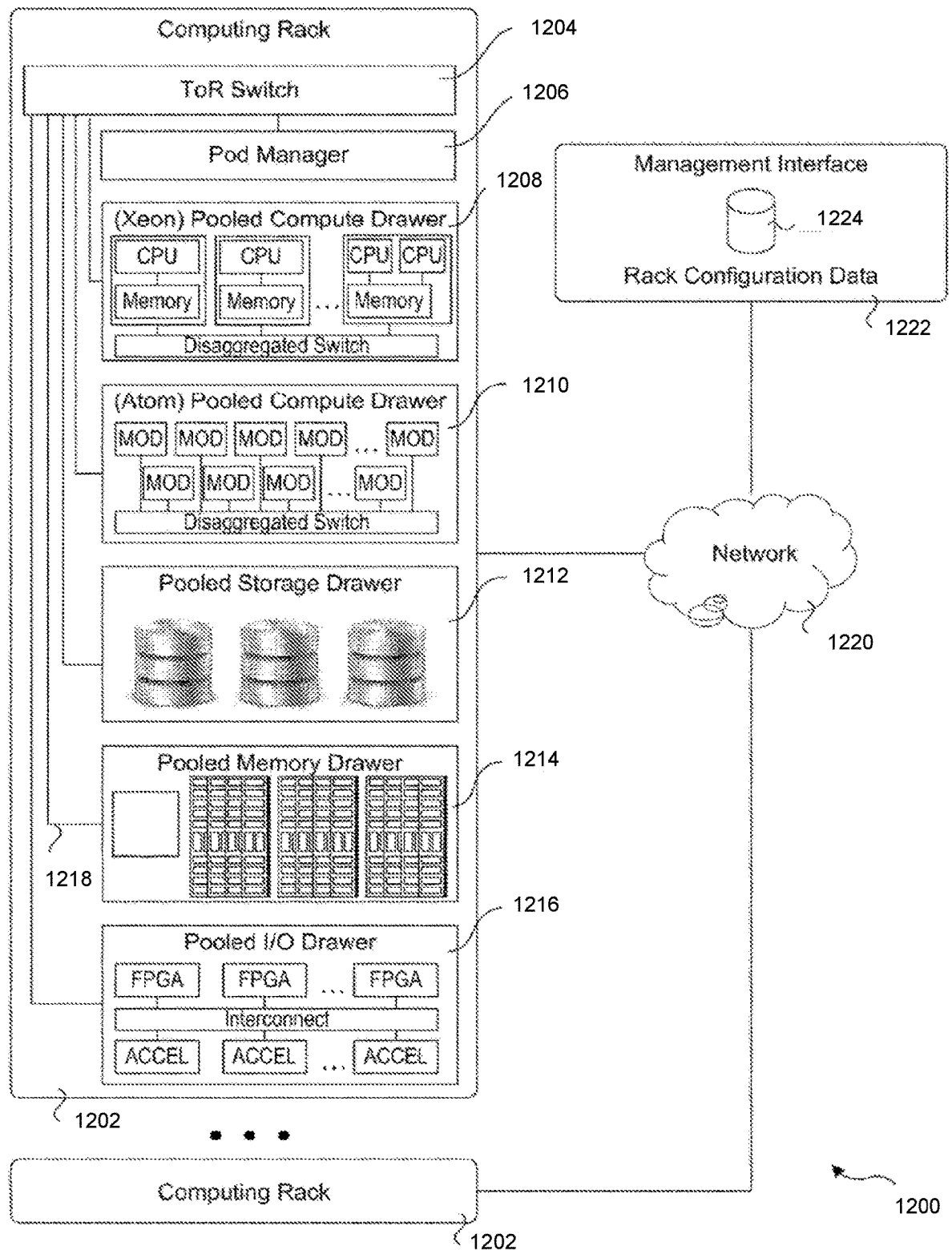
FIG. 12 depicts an environment.

FIG. 12 depicts an environment 1200 includes multiple computing racks 1202, each including a Top of Rack (ToR) switch 1204, a pod manager 1206, and a plurality of pooled system drawers. Various embodiments can use embodiments for remote or local memory erase, program or read operations. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 1208, and Intel® ATOM™ pooled compute drawer 1210, a pooled storage drawer 1212, a pooled memory drawer 1214, and a pooled I/O drawer 1216. Each of the pooled system drawers is connected to ToR switch 1204 via a high-speed link 1218, such as a 40 Gigabit/second (Gb/s) or 100 Gb/s Ethernet link or a 100+Gb/s Silicon Photonics (SiPh) optical link. In one embodiment high-speed link 1218 comprises an 800 Gb/s SiPh optical link.

Multiple of the computing racks 1200 may be interconnected via their ToR switches 1204 (e.g., to a pod-level switch or data center switch), as illustrated by connections to a network 1220. In some embodiments, groups of computing racks 1202 are managed as separate pods via pod manager(s) 1206. In one embodiment, a single pod manager is used to manage all of the racks in the pod. Alternatively, distributed pod managers may be used for pod management operations.

Environment 1200 further includes a management interface 822 that is used to manage various aspects of the environment. This includes managing rack configuration, with corresponding parameters stored as rack configuration data 824.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes a memory controller that includes an interface to a memory array and a controller to: perform a memory access and verify operation in a memory array region, wherein perform a memory access and verify operation comprises: prior to a memory access signal being applied, determine a number of defective bit lines in the memory array region, determine a number of memory access fails; and determine if the memory access operation is defective based on a comparison of the determined number of memory access fails less the determined number of defective bit lines in the memory array region against a threshold number of accepted bit line fails.

Example 2 includes any example, wherein the memory access and verify operation comprises one or more of: erase and erase verify or program and program verify and wherein the memory access signal comprises a non-zero erase or program voltage signal.

Example 3 includes any example, wherein the determine a number of defective bit lines in the memory array region comprises determine a number of open bit lines.

Example 4 includes any example, wherein the determine a number of defective bit lines in the memory array region comprises apply a voltage higher than maximum threshold voltage of cells to word lines of the region and determine bit lines that read as a logical zero.

Example 5 includes any example, wherein the determine a number of defective bit lines in the memory array region comprises determine a number of shorted bit lines.

Example 6 includes any example, wherein determine a number of shorted bit lines comprises determine bit lines shorted at least to a neighboring bit line or shorted to select gates.

Example 7 includes any example, wherein prior to a memory access signal being applied, determine a number of defective bit lines in the memory array region comprises: identify shorted bit lines and inhibit shorted bit lines prior to application of a program signal.

Example 8 includes any example, wherein the memory access signal comprises a program signal and wherein the controller is to determine a starting magnitude of the program signal based on a program voltage magnitude that leads to a passing number of bit lines from a program verify based on a determined number of defective bit lines in the memory array region.

Example 9 includes any example, and includes a memory array coupled to the interface, the memory array comprising one or more of: a single-level cell (SLC) NAND storage device, a multi-level cell (MLC) NAND storage device, triple-level cells (TLC) NAND storage device, quad-level cells (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

Example 10 includes any example, wherein the controller is to: during a read operation of the memory array region, identify read results as weak for soft bit read correction for a read operation that uses bit lines that are open circuit or short circuit.

Example 11 includes a method that includes: during a memory region access operation, determining a number of defective bit lines in the memory region; performing a memory region access verify operation for the memory region access operation, wherein the memory region access verify operation comprises determining a number of failing bit lines for an applied access voltage based on the number of defective bit lines in the memory region; and when the memory region access comprises an erase operation, identifying the erase operation as a failure or success based on a comparison of a number of failing bit lines less the defective bit lines against a threshold level of acceptable failing bit lines.

Example 12 includes any example, wherein when the memory region access operation comprises a program operation, performing: determining shorted bit lines, inhibiting bit lines identified as shorted, and performing program and verify operations.

Example 13 includes any example, wherein determining a number of defective bit lines in the memory region comprises determining a number of open bit lines by applying a voltage higher than maximum threshold voltage of cells to word lines of the region and determining the bit lines that read as a logical zero.

Example 14 includes any example, wherein determining a number of defective bit lines in the memory region comprises determining a number of shorted bit lines by determining bit lines shorted to a neighboring bit line or shorted to select gates.

Example 15 includes any example and includes: during a read operation of the memory region, identifying read results as weak for soft bit read correction for a read operation that uses bit lines that are open or short.

Example 16 includes any example, wherein the memory region comprises a region of one or more of: a single-level cell (SLC) NAND storage device, a multi-level cell (MLC) NAND storage device, triple-level cells (TLC) NAND storage device, quad-level cells (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

Example 17 includes a system comprising: a computing platform comprising a processor; a memory device; and a memory controller communicatively coupled to the memory device and the computing platform, wherein the memory controller is to: receive a request to access a region of the memory device, the request to access a region of the memory device to cause the memory controller to determine defective bit lines, perform a memory access operation, and perform a verify of the memory access operation, wherein the perform a verify of the memory access operation comprises use a number of defective bit lines to determine whether memory access operation succeeds or fails.

Example 18 includes any example, wherein the memory access operation comprises an erase or program operation.

Example 19 includes any example, wherein the memory controller is to receive a command to perform a read operation, wherein to perform the read operation, the memory controller is to perform a read operation and identify read data associated with defective bit lines as weak results for soft bit read correction.

Example 20 includes any example, wherein the memory device comprises one or more of: a single-level cell (SLC) NAND storage device, a multi-level cell (MLC) NAND storage device, triple-level cells (TLC) NAND storage device, quad-level cells (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

What is claimed is:
1. A method comprising:
  during a memory region access operation, determining a number of defective bit lines in the memory region;
  performing a memory region access verify operation for the memory region access operation, wherein the memory region access verify operation comprises determining a number of failing bit lines for an applied access voltage based on the number of defective bit lines in the memory region; and when the memory region access comprises an erase operation, identifying the erase operation as a failure or success based on a comparison of a number of failing bit lines less the number of defective bit lines against a threshold level of acceptable failing bit lines.

2. The method of claim 1, wherein when the memory region access operation comprises a program operation, performing:
determining shorted bit lines,
inhibiting bit lines identified as shorted, and
performing program and verify operations.

3. The method of claim 1, wherein determining a number of defective bit lines in the memory region comprises determining a number of open bit lines by applying a voltage higher than maximum threshold voltage of cells to word lines of the region and determining the bit lines that read as a logical zero.

4. The method of claim 1, wherein determining a number of defective bit lines in the memory region comprises determining a number of shorted bit lines by determining bit lines shorted to a neighboring bit line or shorted to select gates.

5. The method of claim 1, comprising:
during a read operation of the memory region, identifying read results as weak for soft bit read correction for a read operation that uses bit lines that are open or short.

6. The method of claim 1, wherein the memory region comprises a region of one or more of: a single-level cell (SLC) NAND storage device, a multi-level cell (MLC) NAND storage device, triple-level cells (TLC) NAND storage device, quad-level cells (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

7. A system comprising:
a computing platform comprising a processor;
a memory device; and
a memory controller communicatively coupled to the memory device and the computing platform, wherein the memory controller is to:
receive a request to access a region of the memory device, the request to access a region of the memory device to cause the memory controller to determine defective bit lines,
perform a memory access operation, wherein the memory access operation comprises an erase or program operation, and
perform a verify of the memory access operation, wherein the perform a verify of the memory access operation comprises use a number of defective bit lines to determine whether the memory access operation succeeds or fails.

8. The system of claim 7, wherein the memory controller is to receive a command to perform a read operation, wherein to perform the read operation, the memory controller is to:
perform a read operation and
identify read data associated with defective bit lines as weak results for soft bit read correction.

9. The system of claim 7, wherein the memory device comprises one or more of: a single-level cell (SLC) NAND storage device, a multi-level cell (MLC) NAND storage device, triple-level cells (TLC) NAND storage device, quad-level cells (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

10. The system of claim 7, wherein based on the memory access operation comprising a program operation, the memory controller is to:
determine shorted bit lines,
inhibit bit lines identified as shorted, and
perform program and verify operations.

11. The system of claim 7, wherein the determine defective bit lines comprises determine a number of open bit lines by application a voltage higher than maximum threshold voltage of cells to word lines of the region and identify the bit lines that read as a logical zero.

12. The system of claim 7, wherein the determine defective bit lines comprises determine a number of shorted bit lines by determine bit lines shorted to a neighboring bit line or shorted to select gates.

13. An apparatus comprising:
an interface and
a memory controller communicatively coupled to the interface, wherein the memory controller is to:
receive a request to access a region of a memory device, the request to access a region of the memory device to cause the memory controller to determine defective bit lines,
perform a memory access operation, wherein the memory access operation comprises an erase or program operation, and
perform a verify of the memory access operation, wherein the perform a verify of the memory access operation comprises use a number of defective bit lines to determine whether memory access operation succeeds or fails.

14. The apparatus of claim 13, wherein to perform a read operation, the memory controller is to:
perform the read operation and
identify read data associated with defective bit lines as weak results for soft bit read correction.

15. The apparatus of claim 13, wherein based on the memory access operation comprising a program operation, the memory controller is to:
determine shorted bit lines,
inhibit bit lines identified as shorted, and
perform program and verify operations.

16. The apparatus of claim 13, wherein the determine defective bit lines comprises determine a number of open bit lines by application a voltage higher than maximum threshold voltage of cells to word lines of the region and identify the bit lines that read as a logical zero.

17. The apparatus of claim 13, wherein the determine defective bit lines comprises determine a number of shorted bit lines by determine bit lines shorted to a neighboring bit line or shorted to select gates.

18. The apparatus of claim 13, comprising a memory device coupled to the interface.

19. The apparatus of claim 18, wherein the memory device comprises one or more of: a single-level cell (SLC) NAND storage device, a multi-level cell (MLC) NAND storage device, triple-level cells (TLC) NAND storage device, quad-level cells (QLC) storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

20. The apparatus of claim 13, comprising a computing platform coupled to the interface, wherein the computing platform comprises a processor.

* * * * *